(12) United States Patent
Nakayama et al.

(10) Patent No.: US 8,094,693 B2
(45) Date of Patent: Jan. 10, 2012

(54) LASER CONTROL METHOD AND LASER CONTROL CIRCUIT

(75) Inventors: Kunio Nakayama, Tokyo (JP); Koji Ishiwata, Kanagawa (JP); Cheonseok Park, Gyeongsangnam (KR)

(73) Assignee: Sony Disc & Digital Solutions Inc., Tokyo (JP)

( * ) Notice: Subject to any disclaimer, the term of this patent is extended or adjusted under 35 U.S.C. 154(b) by 106 days.

(21) Appl. No.: 12/625,951

(22) Filed: Nov. 25, 2009

(65) Prior Publication Data

US 2010/0150189 A1 Jun. 17, 2010

(30) Foreign Application Priority Data

Dec. 16, 2008 (JP) .................................. 2008-320122

(51) Int. Cl.
*H01S 3/13* (2006.01)
(52) U.S. Cl. ........... 372/29.011; 372/29.015; 372/38.02; 372/38.07; 372/38.01
(58) Field of Classification Search ............. 372/29.011, 372/38.02, 29.015, 38.01, 38.07
See application file for complete search history.

(56) References Cited

U.S. PATENT DOCUMENTS

| 5,771,255 | A * | 6/1998 | Horiuchi et al. ................. 372/31 |
| 7,031,358 | B2 | 4/2006 | Nakayama |
| 2005/0069002 | A1 * | 3/2005 | Senga et al. ............... 372/38.01 |

FOREIGN PATENT DOCUMENTS

| JP | 2-205375 | 8/1990 |
| JP | 3-16191 | 1/1991 |
| JP | 8-37331 | 2/1996 |
| JP | 10-41569 | 2/1998 |
| JP | 2003-218456 | 7/2003 |
| JP | 2004-186626 | 7/2004 |
| JP | 2005-293689 | 10/2005 |
| JP | 2006-185997 | 7/2006 |
| WO | WO 01/08143 A1 | 2/2001 |

OTHER PUBLICATIONS

Office Action issued Nov. 16, 2010 in JP Application No. 2008-320122.

* cited by examiner

*Primary Examiner* — Jessica Stultz
*Assistant Examiner* — Delma R Forde
(74) *Attorney, Agent, or Firm* — Oblon, Spivak, McClelland, Maier & Neustadt, L.L.P.

(57) ABSTRACT

A laser control method includes the steps of: using a laser control circuit which includes a constant current circuit that maintains a constant current flowing through a semiconductor laser element, and which includes an adder and a multiplier connected to a stage preceding the constant current circuit, and using detection means for calibration for detecting an applied laser output; calculating, on the basis of a detection signal output from the detection means, a reference bias value and a reference gain value for obtaining a specified laser output with respect to a specified input to the multiplier; inputting the reference bias value and the reference gain value to the adder and the multiplier, respectively; and controlling the applied laser output from the semiconductor laser element by performing calibration.

15 Claims, 10 Drawing Sheets

LASER CONTROL METHOD AND LASER CONTROL CIRCUIT

BACKGROUND OF THE INVENTION

1. Field of the Invention

The present invention relates to a laser control method and a laser control circuit which control an applied laser output when laser light is applied from a semiconductor laser element to an irradiated body.

2. Description of the Related Art

In the past, a semiconductor laser has been used in a data recording device which records data on a recordable optical disc and a recording device which records data in the process of producing a master optical disc (stamper) (so-called cutting device).

The master optical disc is produced as follows, for example. A resist film is formed on a glass substrate. Thereafter, the resist film is irradiated with laser light emitted from a semiconductor laser in accordance with ON-OFF control. Thereby, a latent image according to a data pattern is thermally recorded on the resist film. Then, the resist film is subjected to a development process, and a portion irradiated with the laser light is removed therefrom. Thereafter, the resist film is metal-plated, e.g., nickel-plated. Then, a nickel-plated layer is peeled off from the resist layer to form a stamper, which is a master optical disc.

In the above-described data recording device, which records data on an optical disc, and a recording device for a master optical disc, which uses a PTM (Phase Transition Mastering) microfabrication technology, a write strategy is commonly used as a method of controlling recording laser light. There are a variety of methods for the write strategy. In the write strategy, the light emission waveform characteristic of the laser light is important. The recording characteristic is deteriorated due to waveform degradation such as rounding of a light emission waveform with respect to an input signal. That is, the light emission waveform is desired to have a rectangular wave 101 illustrated in FIG. 10A. With a rounded waveform 102 illustrated in FIG. 10B, the recording characteristic is deteriorated. The waveform degradation tends to occur particularly in high-speed recording or the like. To ensure the recording characteristic, a favorable signal transmission characteristic is desired in a range including a higher frequency band.

FIG. 11 illustrates an example of an existing laser control circuit. The laser control circuit 103 is configured such that a light receiving element 105 receives a part $L_1$ of laser light emitted from a semiconductor laser element 104, and that a feedback is applied to a signal output from the light receiving element 105 to electrically control the laser output to continue to be constant. This type of laser control is generally called Auto Power Control (APC).

For example, a recording device used in the production of a master optical disc is provided with an optical pickup for recording data, and laser light from a semiconductor laser element is applied to a resist film through respective optical elements. The laser control circuit 103 of FIG. 11 is configured as a feedback circuit including a photodiode (PD), which is the light receiving element 105 (hereinafter referred to as the photodiode 105) for receiving the part $L_1$ of the laser light emitted from the semiconductor laser element (LD) 104 of the optical pickup. That is, the laser control circuit 103 is configured to include the photodiode 105, an adder 106, an operational amplifier 107, and a transistor 108. An output signal of the photodiode 105 and a bias setting voltage are input to the adder 106, and an output of the adder 106 is input to an inverting input terminal (−) of the operational amplifier 107. The output signal of the photodiode 105 corresponds to an output voltage according to the laser output (light intensity) from the semiconductor laser element 104. A non-inverting input terminal (+) of the operational amplifier 107 receives an input of an input signal, i.e., a write signal (pulse signal) corresponding to data to be recorded. The output of the operational amplifier 107 is input to the base of the transistor 108. The collector of the transistor 108 is connected to a power supply, and the emitter of the transistor 108 is connected to the anode of the semiconductor laser element 104.

In the laser control circuit 103, the laser characteristic of the semiconductor laser element 104 fluctuates due to long-time use. That is, in the laser characteristic set to obtain a specified laser output with respect to a specified write signal input to the non-inverting input terminal (+) of the operational amplifier 107, the bias setting voltage and the gain setting voltage fluctuate. If the laser output is reduced due to the fluctuation of the laser characteristic, the output signal of the photodiode 105 is reduced, and the input from the adder 106 to the inverting input terminal (−) of the operational amplifier 107 is reduced. As a result, the output of the operational amplifier 107 is increased, and the current flowing through the semiconductor laser element 104 is increased. Thereby, the laser output is maintained to be constant.

Even if the laser control circuit 103 is formed by the fastest device available at present, the relationship between the frequency of the write signal and the laser output is as illustrated in FIG. 12, wherein the output is reduced in an approximate range of 50 MHz to 100 MHz.

As illustrated in FIG. 13, as a measure to address the above issue, a laser control circuit 110 has been used which corresponds to the laser control circuit 103 of FIG. 11 inserted with a compensation circuit 113 for compensating a high-frequency range. The laser control circuit 110 is provided with the compensation circuit 113, i.e., a so-called high-frequency feedback circuit, which includes a series circuit formed by a capacitor (C) 111 and a resistor (R) 112 and inserted between the output of the operational amplifier 107 and one of the input terminals of the adder 106 in FIG. 11.

In the laser control circuit 110, a low-frequency range is compensated by the feedback of the laser light, and a high-frequency range is compensated by the high-frequency feedback circuit formed by the compensation circuit 113. As illustrated in the frequency characteristic of FIG. 14, therefore, the laser output is expected to be stabilized in a range including the high-frequency range.

Japanese Unexamined Patent Application Publication No. 2004-186626 discloses a semiconductor laser drive device which controls and drives a semiconductor laser of a cutting device for a master optical disc.

SUMMARY OF THE INVENTION

Meanwhile, even with the measure using the above-described laser control circuit 110 illustrated in FIG. 13, which compensates up to the high-frequency range, the resultant effect is insufficient. That is, in the use of a recording device, the optical feedback amount varies due to the deterioration of a semiconductor laser or another optical component or the operation temperature characteristics of respective optical components. As illustrated in FIGS. 15 and 16, therefore, the frequency characteristic fluctuates in the low-frequency range. The high-frequency range feedback amount provided by the compensation circuit 113 for the high-frequency range is electrically fixed. Therefore, the frequency characteristic is unchanged in the high-frequency range. Accordingly, while the laser output is constant both in the low-frequency range and the high-frequency range illustrated in FIG. 14, the laser output fluctuates between the low-frequency range and the high-frequency range, as illustrated in FIGS. 15 and 16. As a result, the balance between the frequency characteristic in the low-frequency range and the frequency characteristic in the high-frequency range is lost. In FIG. 15, the laser output in the low-frequency range is increased to be higher than the laser output in the high-frequency range. In FIG. 16, the laser output in the low-frequency range is reduced to be lower than the laser output in the high-frequency range. In this case, if a change from the state of FIG. 14 to the state of FIG. 15 occurs, for example, the write strategy schematically illustrated in FIG. 17 changes to the write strategy illustrated in FIG. 18. As a result, the overall light emission waveform of the laser is deteriorated. An appropriate pulse light emission waveform of FIG. 17, wherein a rising edge forms a rectangular wave, is deteriorated into a pulse light emission waveform of FIG. 18, wherein the entire rising edge is rounded and a falling edge is also rounded.

Further, even if a high-speed feedback circuit is used to address the above issue, continued use results in the deterioration of optical components. Further, the operation temperature fluctuates in accordance with the use environment and the use state. Therefore, the above measure does not provide a fundamental solution.

The present invention has been made in view of the above-described issues. It is desirable to provide a laser control method and a laser control circuit which stabilize the laser output in a range including a high-frequency band.

A laser control method according to an embodiment of the present invention uses a laser control circuit which includes a constant current circuit that maintains a constant current flowing through a semiconductor laser element, and which includes an adder and a multiplier connected to a stage preceding the constant current circuit. The laser control method also uses detection means for calibration for detecting an applied laser output. On the basis of a detection signal output from the detection means, the laser control method calculates a reference bias value and a reference gain value for obtaining a specified laser output with respect to a specified input to the multiplier. Then, the laser control method inputs the calculated reference bias value and reference gain value to the adder and the multiplier, respectively, and controls the applied laser output from the semiconductor laser element by performing calibration.

Preferably, in addition to the above-described laser control, the laser control method according to the embodiment of the present invention may use a monitoring photodetector which detects laser light emitted from the semiconductor laser element, and may automatically control the reference bias value or both the reference bias value and the reference gain value on the basis of a detection signal output from the monitoring photodetector. Thereby, minute fluctuation of the applied laser output is controlled.

The laser control method according to the embodiment of the present invention uses the constant current circuit to obtain a frequency characteristic in which the laser output is constant both in a low-frequency range and a high-frequency range. Further, the laser control method calculates the reference bias value and the reference gain value on the basis of the detection signal output from the detection means for calibration for detecting the applied laser output, and inputs the reference bias value and the reference gain value to the adder and the multiplier, respectively, to thereby perform automatic calibration. If the automatic calibration is periodically performed, the applied laser output can be maintained to be constant for a long period of time until the semiconductor laser is destroyed.

In addition, if the laser control method automatically controls the reference bias value or both the reference bias value and the reference gain value on the basis of the detection signal output from the monitoring photodetector, the minute fluctuation of the applied laser output during the interval between the calibrations is controlled.

A laser control circuit according to an embodiment of the present invention includes a constant current circuit configured to maintain a constant current flowing through a semiconductor laser element, and an adder connected to an operational amplifier of the constant current circuit and configured to receive an input of a reference bias value calculated on the basis of a detection signal output from detection means for detecting an applied laser output from the semiconductor laser element. The laser control circuit according to the embodiment of the present invention further includes a multiplier connected to the adder and configured to receive an input of an input signal and an input of a reference gain value calculated on the basis of a detection signal output from the detection means. With this configuration, the applied laser output from the semiconductor laser element is automatically controlled.

Preferably, the above-described laser control circuit according to the embodiment of the present invention may include a monitoring photodetector configured to detect laser light emitted from the semiconductor laser element. The laser control circuit according to the embodiment of the present invention may be configured to automatically control the reference bias value or both the reference bias value and the reference gain value on the basis of a detection signal output from the monitoring photodetector, to thereby control minute fluctuation of the applied laser output.

The laser control circuit according to the embodiment of the present invention includes the constant current circuit to obtain a frequency characteristic in which the laser output is constant both in a low-frequency range and a high-frequency range. Further, the laser control circuit inputs to the adder the reference bias value calculated on the basis of the detection signal output from the detection means for detecting the applied laser output, and inputs to the multiplier the reference gain value calculated in a similar manner. Accordingly, the applied laser output from the semiconductor laser element is automatically controlled. That is, calibration is automatically performed.

In addition, if the laser control circuit includes the monitoring photodetector which detects the laser light emitted from the semiconductor laser element, the laser control circuit can automatically control the reference bias value or both the reference bias value and the reference gain value on the basis of the detection signal output from the monitoring photodetector. Accordingly, minute fluctuation of the applied laser output during the interval between the calibrations is controlled.

The laser control method and the laser control circuit according to the embodiment of the present invention are capable of stabilizing the laser output in a range including a high-frequency band.

DESCRIPTION OF THE PREFERRED EMBODIMENTS

Preferred embodiments (hereinafter referred to as embodiments) for implementing the invention will be described below. The description will be made in the following order: 1. Introductory Description of Embodiments (Example of Constant Current Circuit Applied to Present Embodiments), 2. First Embodiment (Example of Laser Control Method and Laser Control Circuit), 3. Second Embodiment (Example of Laser Control Method and Laser Control Circuit), 4. Third Embodiment (Example of Laser Control Method and Laser Control Circuit), and 5. Fourth Embodiment (Example of Laser Control Method and Laser Control Circuit).

1. Introductory Description of Embodiments

Embodiments of the present invention relate to laser control. The present embodiments particularly relate to the control of the laser output of a semiconductor laser element used in a recording device for producing a master optical disc, such as a CD (Compact Disc), a DVD (Digital Versatile Disc), and a Blu-ray Disc (registered trademark: hereinafter referred to as BD), or for recording information on an optical disc. The present embodiments further relate to the control of the laser output of a semiconductor laser element used in a reproduction device for an optical disc.

According to the present embodiments, in a high-speed laser control circuit, the deterioration of a semiconductor laser element or an optical component due to change over time is corrected by periodical calibration. Thereby, the laser light emission characteristic with respect to the input signal is maintained in the long term. Further, according to the present embodiments, the calibration is automated to achieve high reliability and reduction of the calibration time.

Example of Constant Current Circuit Applied to Present Embodiments: The deterioration of a semiconductor laser element generally appears as an increase in a laser light emission start current Ith (so-called bias current) and a reduction in a light emission differential efficiency (so-called gain ratio). The temperature characteristic appears as a change in the laser light emission start current Ith. Further, the deterioration of an optical component in an outgoing optical path, particularly a change in optical transmittance, can be regarded as a change in the gain of the optical path.

Figure 6:
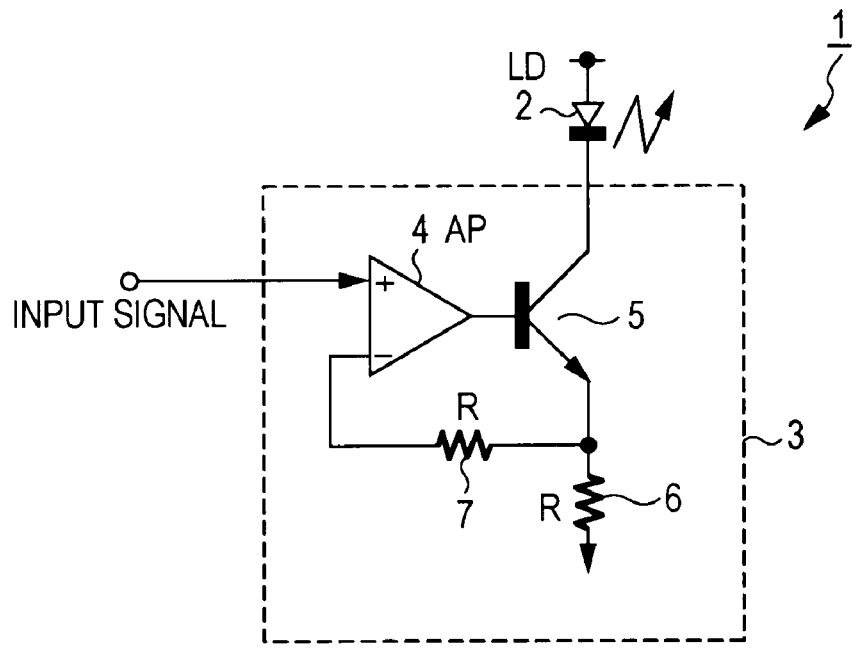
FIG. 6 is a configuration diagram illustrating a laser control circuit using a constant current circuit applied to the present invention.

A laser control circuit according to each of the present embodiments is assumed to include a constant current circuit incorporated therein. In the present embodiments, as illustrated in FIG. 6, a laser control circuit 1 is formed by a semiconductor laser element 2 provided to an optical pickup, and a constant current circuit 3 connected to the cathode of the semiconductor laser element 2. The constant current circuit 3 is configured to include an operational amplifier 4 having a non-inverting input terminal (+), an inverting input terminal (−), and an output terminal, a transistor 5, and resistors 6 and 7. The transistor 5 is formed by, for example, an NPN transistor. The output terminal of the operational amplifier 4 is connected to the base of the transistor 5, and the emitter of the transistor 5 is connected to the inverting input terminal (−) of the operational amplifier 4 via the resistor 7. The collector of the transistor 5 is connected to the cathode of the semiconductor laser element 2, and the emitter of the transistor 5 is connected to the earth via the resistor 6. The non-inverting input terminal (+) of the operational amplifier 4 receives an input of an input signal.

In accordance with the input signal, the constant current circuit 3 controls a current flowing between the collector and the emitter. Thereby, a constant current flows through the semiconductor laser element 2. The constant current circuit 3 is driven at high speed.

Figure 7:
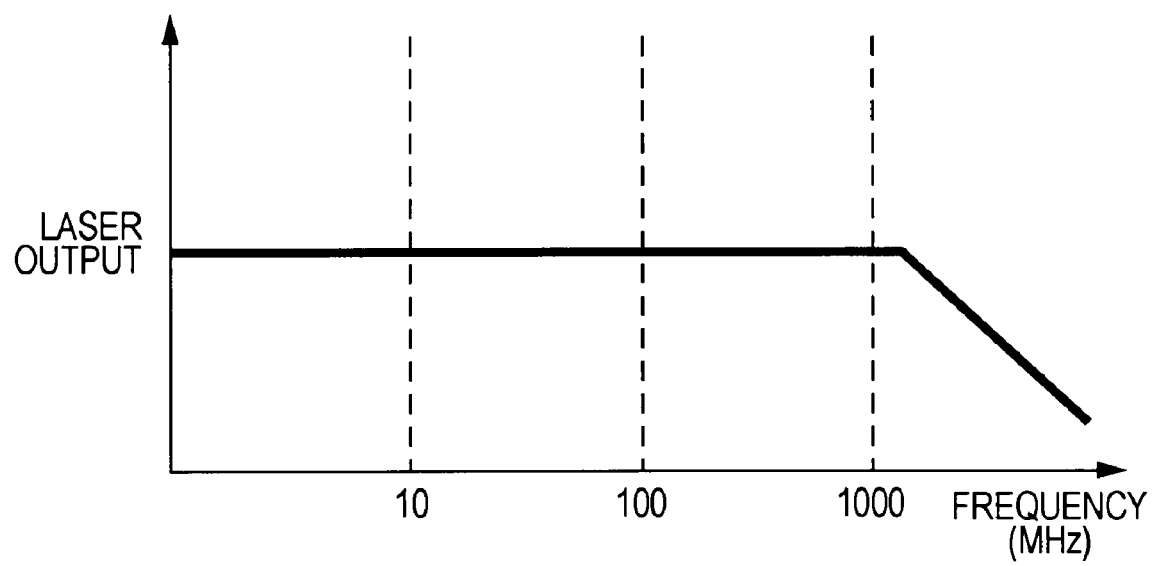
FIG. 7 is a frequency characteristic diagram of the laser control circuit of FIG. 6.

As illustrated in FIG. 7, the laser control circuit 1 including the constant current circuit 3 incorporated therein has a high-frequency characteristic in which the laser output (light emission power) is flat both in a low-frequency range and a high-frequency range. Solely with the laser control circuit 1 including the constant current circuit 3 incorporated therein, however, the issue of the deterioration of an optical component due to the use of a semiconductor laser and the issue of the change in the temperature characteristic are not well addressed. Even if the light emission waveform is unchanged, the laser output, i.e., the light emission power level is reduced.

The embodiments of the present invention described below are configured such that the constant current circuit is improved to particularly reduce the deterioration of the light emission waveform. Measures to address the issue of the change in the temperature characteristic are provided by many related art techniques. Therefore, the related art techniques are used here.

The embodiments of the present invention use two major measures for improvement. The first measure is the periodical calibration. The second measure is the correction of the laser output using the calibration result. Each of the measures has a preparatory factor for implementing the other measurement for improvement, but exhibits the effect thereof even when used singly.

If the periodical calibration is performed, a device can be used for a certain period of time, even without the correction of the laser output. The correction of the laser output has a function of increasing the calibration interval and a function of correcting minute fluctuation in short-term use of the device.

In the past, the periodical calibration of a device has been commonly performed. If the calibration is not performed, the laser light emission waveform with respect to the input signal is changed due to the increase in the laser light emission start current Ith of the semiconductor laser element and the reduction in the light emission differential efficiency described above. Description will be made with reference to FIGS. 8 and 9.

Figure 8:
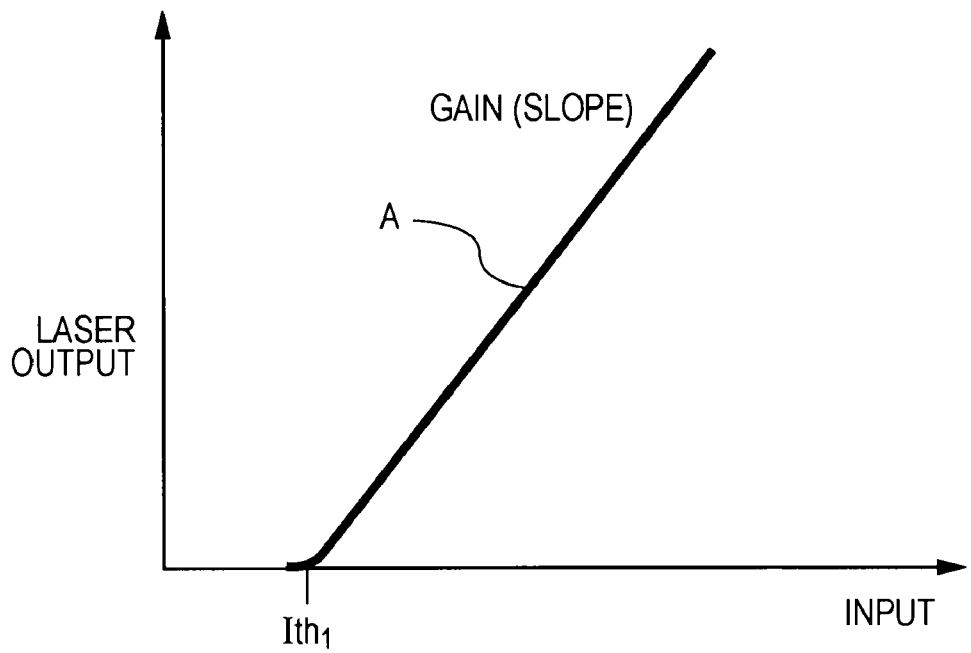
FIG. 8 is a laser characteristic diagram used to explain the present invention.
Figure 9:
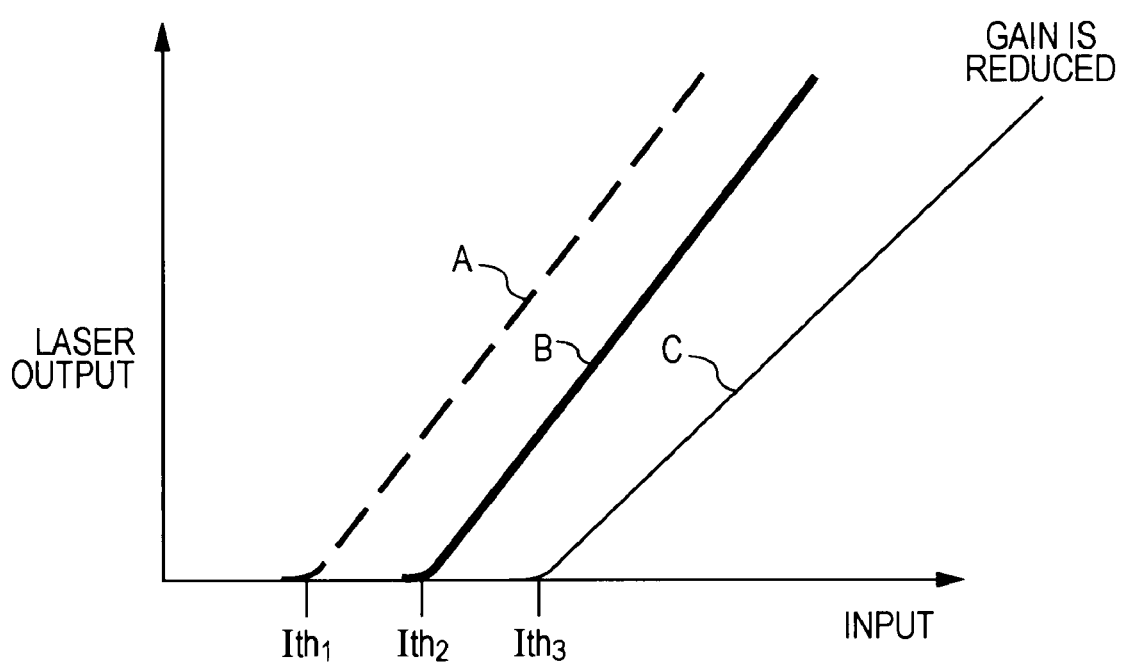
FIG. 9 is a laser characteristic diagram obtained when a fluctuation in laser output occurs.
Figures 10A, 10B:
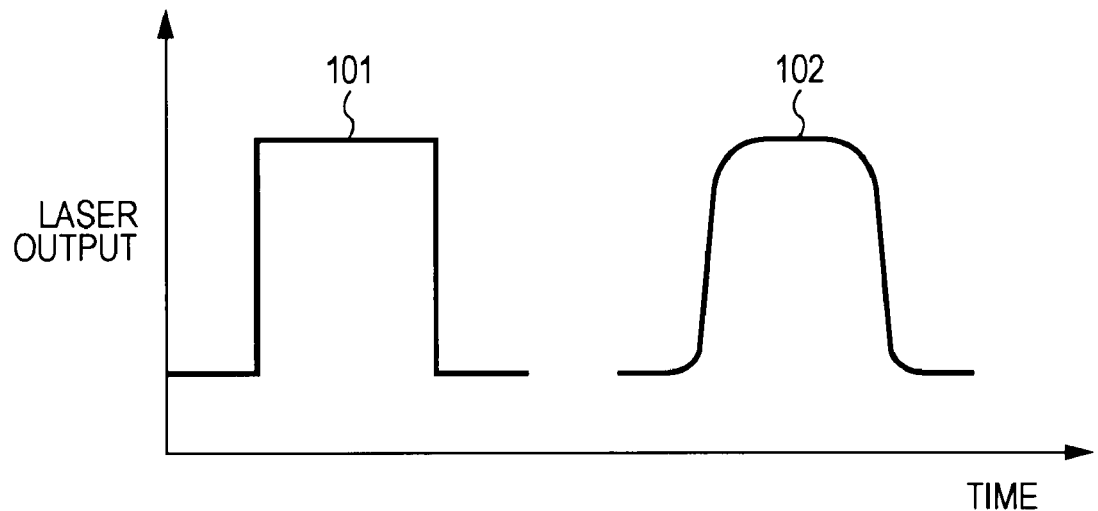
FIGS. 10A and 10B are waveform diagrams each illustrating a light emission waveform of the laser output.
Figure 11:
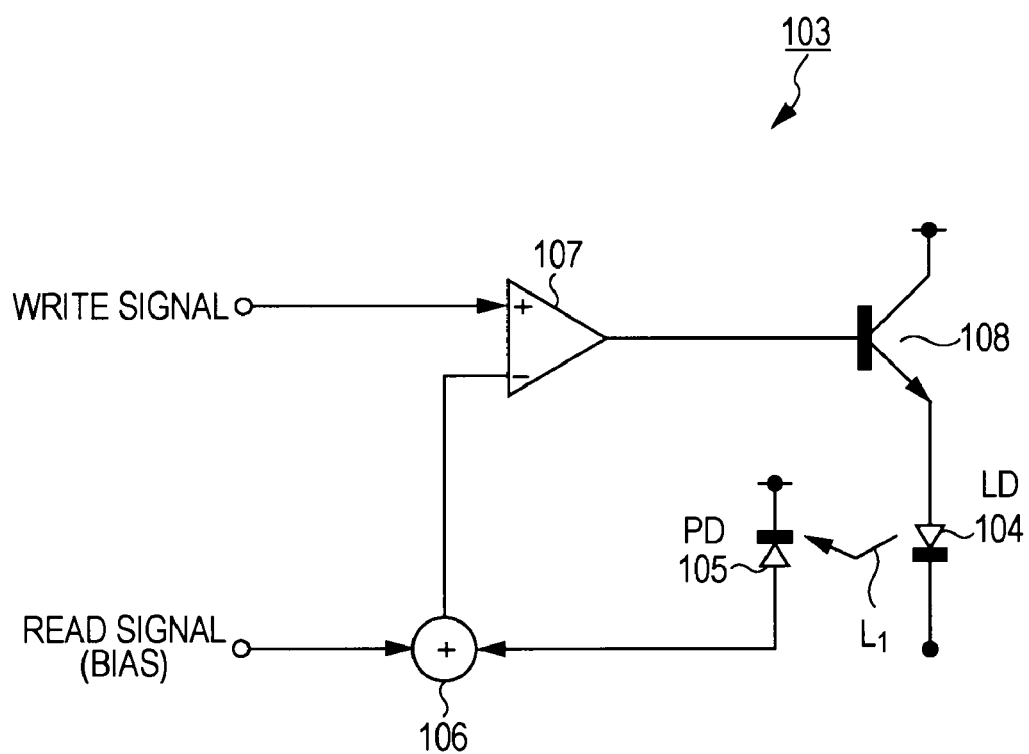
FIG. 11 is a configuration diagram illustrating an example of an existing laser control circuit.
Figure 12:
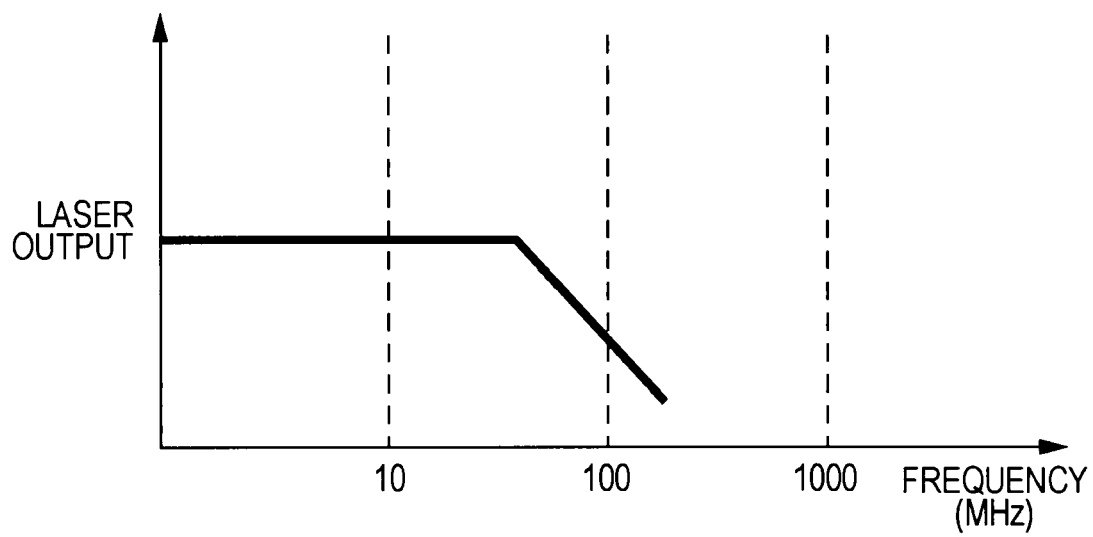
FIG. 12 is a frequency characteristic diagram of the laser control circuit of FIG. 11.
Figure 13:
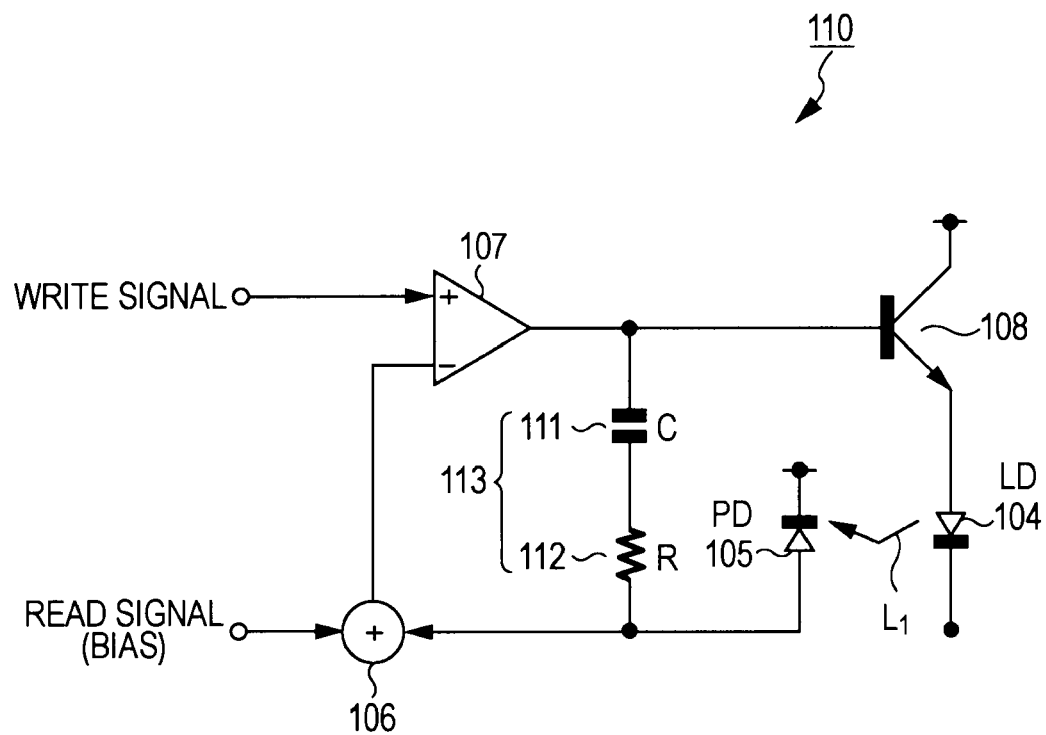
FIG. 13 is a configuration diagram illustrating another example of the existing laser control circuit.
Figure 14:
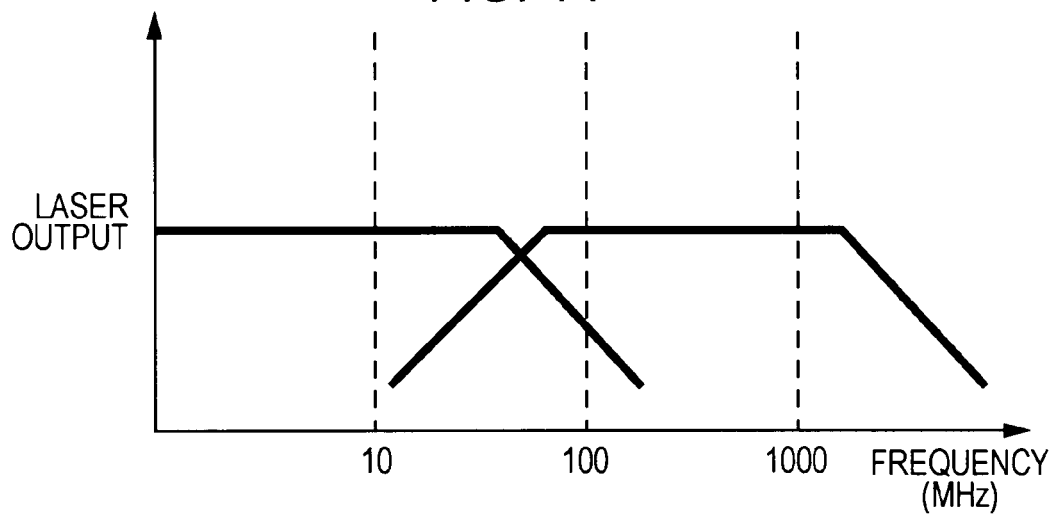
FIG. 14 is a frequency characteristic diagram of the laser control circuit of FIG. 13.
Figure 15:
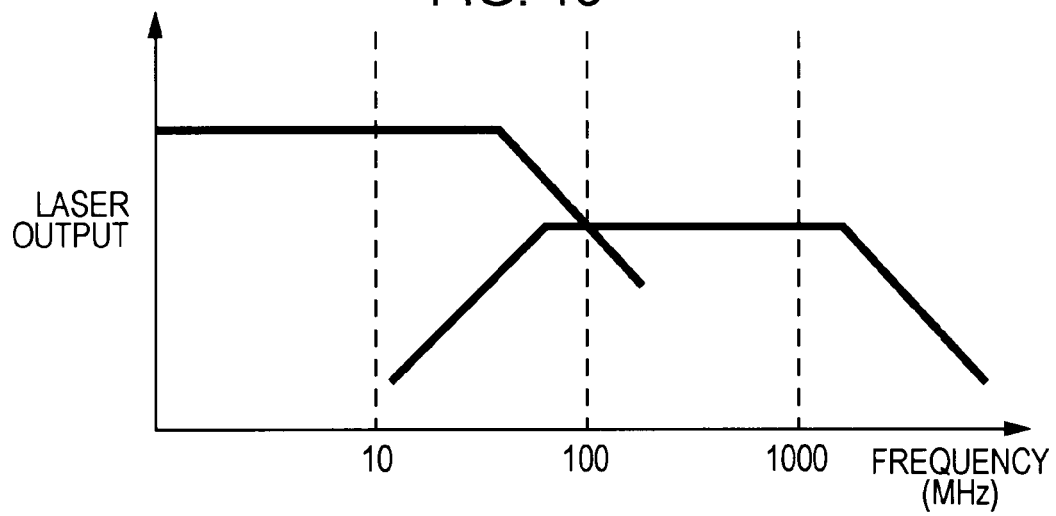
FIG. 15 is a frequency characteristic diagram of the laser control circuit of FIG. 13 obtained when a fluctuation in a low-frequency range occurs.
Figure 16:
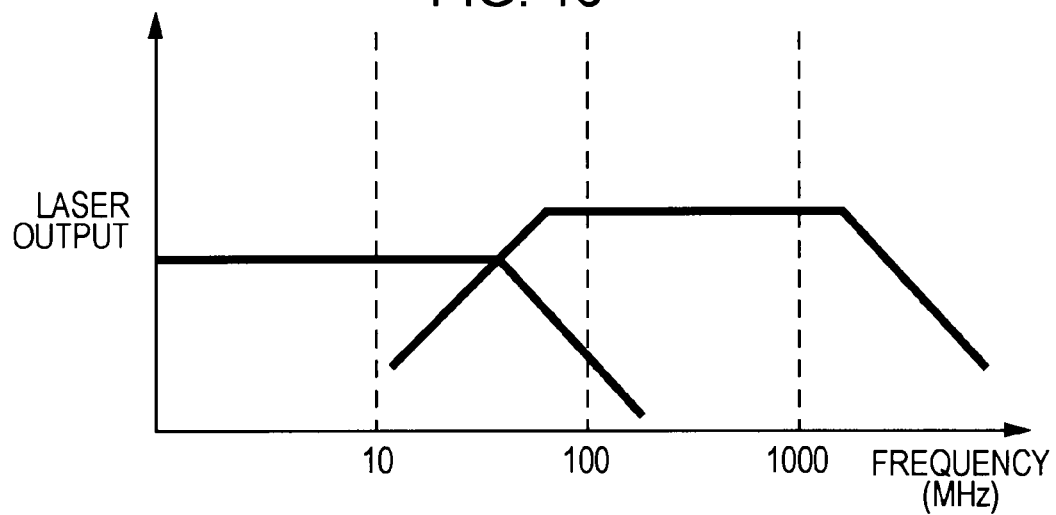
FIG. 16 is a frequency characteristic diagram of the laser control circuit of FIG. 13 obtained when a fluctuation in a low-frequency range occurs.
Figure 17:
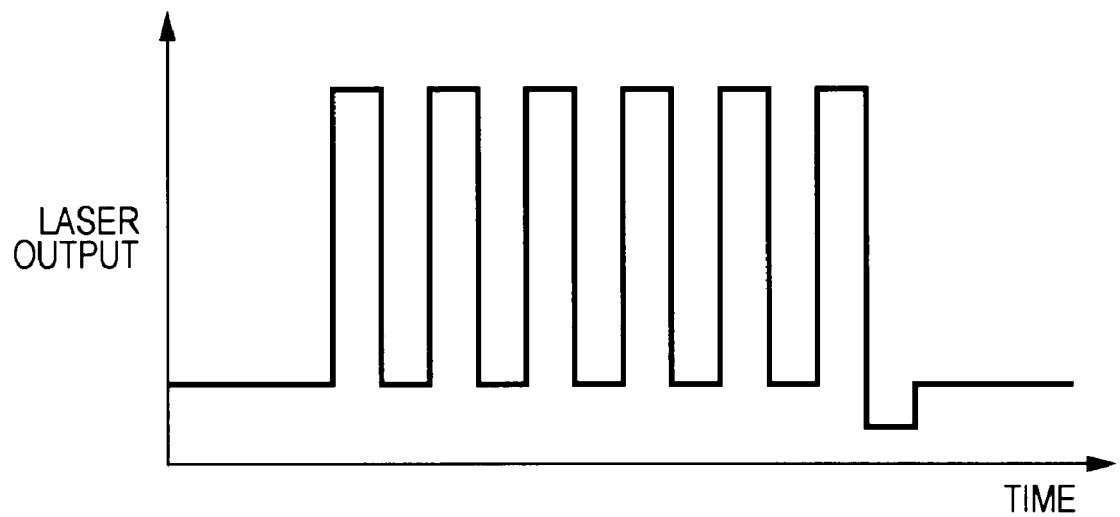
FIG. 17 is a waveform diagram illustrating an appropriate laser output waveform.
Figure 18:
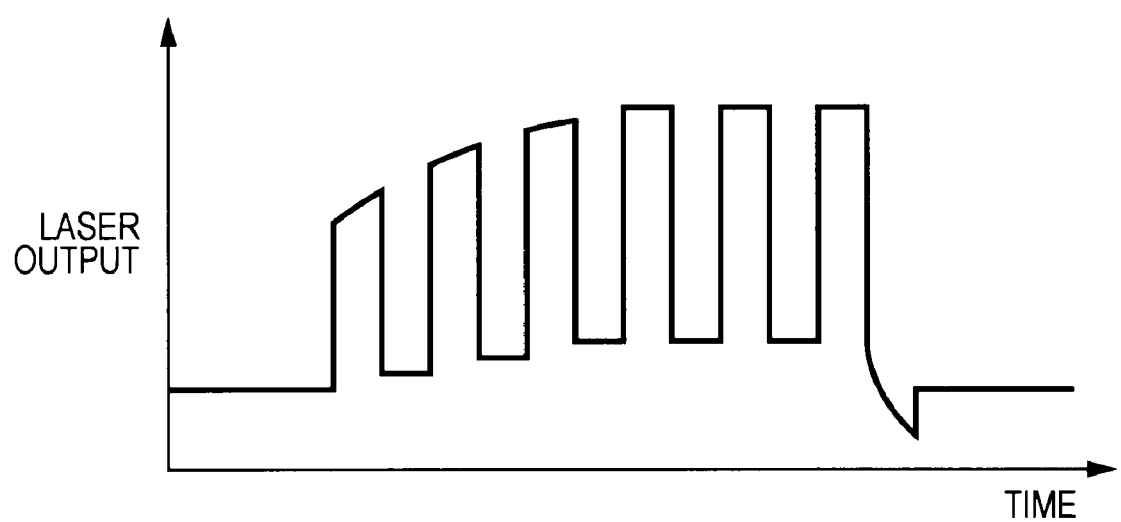
FIG. 18 is a waveform diagram illustrating a deteriorated laser output waveform.

FIG. 8 illustrates the laser output characteristic of the semiconductor laser element 2 in an initial use state with respect to the input (corresponding to the input signal) to the laser control circuit 1, i.e., a laser characteristic A in the initial use state. In the characteristic A, as the current increases from a laser light emission start current (bias current) Ith1, the laser output increases substantially linearly. The slope of a straight line representing the characteristic A corresponds to the light emission differential efficiency (the gain of the circuit including the semiconductor laser element 2 and the operational amplifier 4). FIG. 9 illustrates similar laser characteristics B and C obtained after a long time of use. In the laser characteristic B, a laser light emission start current Ith2 is higher than the corresponding current in the laser characteristic A in the initial state. In the laser characteristic C, a laser light emission start current Ith3 is higher than the corresponding current in the laser characteristic A in the initial state, and the gain is smaller than the gain of the laser characteristic A. Due to the fluctuation of the semiconductor laser characteristics B and C, the light emission waveform is changed.

To continue to maintain a desired laser output, the embodiments of the present invention readjust the laser light emission start current (bias current) and the gain to obtain a specified output with respect to a specified input.

2. First Embodiment

Figure 1:
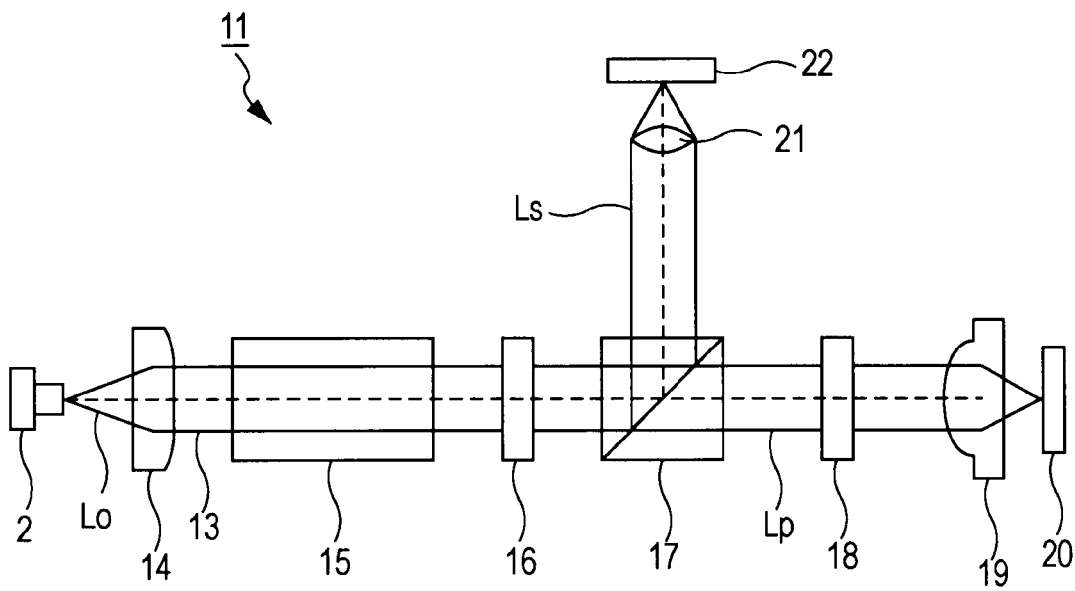
FIG. 1 is a configuration diagram illustrating an embodiment of an optical pickup applied to the present invention.

Example of Laser Control Method and Laser Control Circuit: Firstly, FIG. 1 illustrates an embodiment of an optical pickup which performs a recording or reproduction operation by using a semiconductor laser applied to the present invention. The optical pickup is provided to a recording device, a reproduction device, or a recording and reproduction device (the present invention relates to laser control, and thus description of an optical path for reproduction will be omitted). An optical pickup 11 of the present embodiment includes the semiconductor laser element 2 functioning as a light source, and a collimator lens 14, an anamorphic prism 15, a half-wavelength plate 16, a polarizing beam splitter 17, a quarter-wavelength plate 18, and an objective lens 19 sequentially arranged along an optical path 13 of laser light. In the present embodiment, a monitoring photodetector formed by a photodiode (hereinafter referred to as monitoring photodetector) 22 is disposed on an optical path changed by the polarizing beam splitter 17, with a condenser lens 21 disposed between the monitoring photodetector 22 and the polarizing beam splitter 17. Further, on a preparatory phase prior to the recording or reproduction operation, a power meter 20, for example, which is detection means for detecting the laser output of laser light Lp, i.e., the applied laser output, is disposed in the vicinity of the focus position of the objective lens 19. The reason for disposing the power meter 20 in the vicinity of the focus position is because, if the power meter 20 is disposed exactly at the focus position, the detector may be burned, i.e., because burning of the detector is prevented with such disposition.

In the optical pickup 11, laser light Lo emitted from the semiconductor laser element 2 is converted into parallel light by the collimator lens 14, beam-shaped into a circular spot by the anamorphic prism 15, and transmitted through the half-wavelength plate 16. A part of the transmitted laser light, e.g., the P-polarized component Lp is transmitted through the polarizing beam splitter 17, converted into circularly polarized light by the quarter-wavelength plate 18, and applied to an irradiated body through the objective lens 19. In the production of a master optical disc, the irradiated body is a substrate coated with a resist film. In the recording or reproduction of information, the irradiated body is an optical disc.

The other part of the laser light, e.g., an S-polarized component Ls is reflected by the polarizing beam splitter 17, transmitted through the condenser lens 21, and received by the monitoring photodetector 22. Meanwhile, on a preparatory phase prior to the recording or reproduction operation, the irradiated body is replaced by the power meter 20 disposed in the vicinity of the focus position of the objective lens 19, and the laser output (light intensity) of the light collected through the objective lens 19 is detected.

As described above, the laser control according to the embodiments of the present invention is applicable to the production of a master optical disc, the recording of information on an optical disc, the reproduction of information from an optical disc, and so forth. In the following embodiments, description will be made of an example in which the laser control is applied to the production of a master optical disc.

Figure 2:
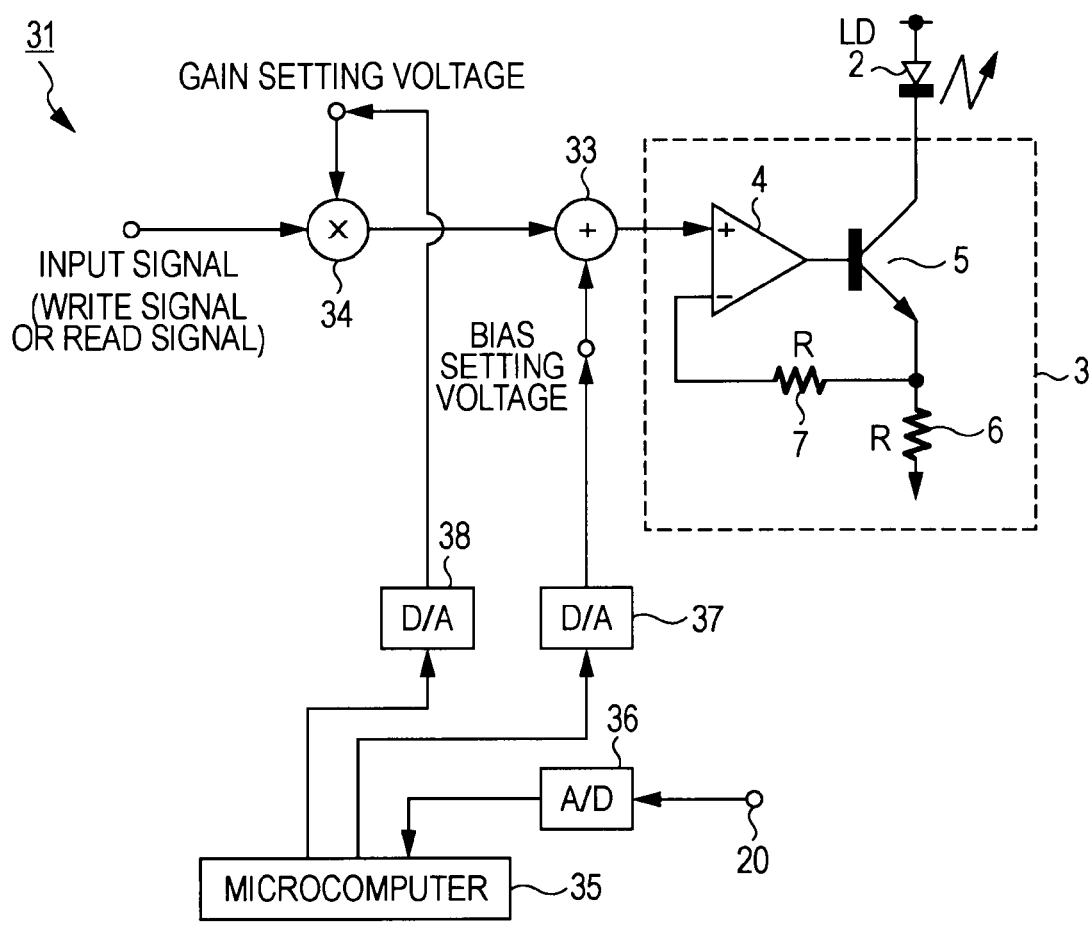
FIG. 2 is a configuration diagram of a laser control circuit according to a first embodiment of the present invention.

With reference to FIG. 2, a laser control method and a laser control circuit according to a first embodiment of the present invention will be described. A laser control circuit 31 according to the first embodiment is configured to include the constant current circuit 3 connected to the cathode of the semiconductor laser element 2 provided to the optical pickup 11, and an adder 33 and a multiplier 34 connected to a stage preceding the constant current circuit 3. Similarly as in the above-described example, the constant current circuit 3 is configured to include the operational amplifier 4 having a non-inverting input terminal (+), an inverting input terminal (−), and an output terminal, the transistor 5, and the resistors 6 and 7. The output terminal of the operational amplifier 4 is connected to the base of the transistor 5, and the emitter of the transistor 5 is connected to the inverting input terminal (−) of the operational amplifier 4 via the resistor 7. The collector of the transistor 5 is connected to the cathode of the semiconductor laser element 2, and the emitter of the transistor 5 is connected to the earth via the resistor 6. The non-inverting input terminal (+) of the operational amplifier 4 receives an input of an input signal.

The multiplier 34 is configured such that the input signal, which is a write signal (pulse signal) in the present example, is input to a first input terminal thereof, and that a gain setting voltage is input to a second input terminal thereof. An output terminal of the multiplier 34 is connected to a first input terminal of the adder 33. A second input terminal of the adder 33 is applied with a bias setting voltage, and an output terminal of the adder 33 is connected to the non-inverting input terminal (+) of the operational amplifier 4 of the constant current circuit 3.

Meanwhile, a microcomputer 35, a first A/D (Analog-to-Digital) converter 36, a first D/A (Digital-to-Analog) converter 37, and a second D/A converter 38 are provided. An input terminal of the first A/D converter 36 is connected to an output terminal of the power meter 20 of the optical pickup 11, and an output terminal of the first A/D converter 36 is connected to the microcomputer 35. An input terminal of the first D/A converter 37 is connected to the microcomputer 35, and an output terminal of the first D/A converter 37 is connected to the second input terminal of the adder 33 supplied with the bias setting voltage. An input terminal of the second D/A converter 38 is connected to the microcomputer 35, and an output terminal of the second D/A converter 38 is connected to the second input terminal of the multiplier 34 supplied with the gain setting voltage.

Subsequently, the laser control method of the first embodiment and the operation of the laser control circuit 31 will be described. In the laser control circuit 31 of the present embodiment, the input signal representing write data, i.e., the write signal is externally input to the input terminal of the multiplier 34. In the input signal, a reference bias value and a reference gain value are adjusted as the bias setting voltage and the gain setting voltage, respectively, in the laser control circuit 31 such that the specified laser output (applied laser output) can be obtained with respect to the specified input.

Firstly, with respect to a plurality of inputs, laser outputs are individually measured by the power meter 20, and the measurement results are subjected to the least squares method or the like to derive a linear expression po=ax+b. The values po and x represent the laser output and the input, respectively. Then, the value b of the linear expression is determined as the reference bias value corresponding to the bias setting voltage of the circuit, and the value a is determined as the reference gain value corresponding to the gain setting voltage of the circuit. More specifically, the reference bias value and the reference gain value, which are initially unknown, are calculated as follows. Initially, laser outputs with respect to a plurality of inputs are measured with the gain value set to zero. Further, a reference bias value corresponding to the light emission start current Ith is calculated. Then, laser outputs with respect to a plurality of inputs are measured with the gain value set to an arbitrary predictable value. On the basis of the measurement results, the reference gain value is calculated from the difference between the arbitrarily set gain value and the gain value with which the specified laser output can be obtained with respect to the target specified input.

The reference bias value (voltage) and the reference gain value (voltage) are automatically calculated by a program stored in the microcomputer 35, on the basis of the actually measured values obtained by the use of the power meter 20 and input to the microcomputer 35 via the first A/D converter 36. The reference bias value is supplied to the second input terminal of the adder 33 via the first D/A converter 37. Further, the reference gain value is switched from the initial arbitrary gain value to the calculated reference gain value and supplied to the second input terminal of the multiplier 34 via the second D/A converter 38.

After the normal input signal is input to the first input terminal of the multiplier 34, the input signal is multiplied by the reference gain value, and a resultant output signal is input to the first input terminal of the adder 33. The adder 33 adds the output signal of the multiplier 34 to the reference bias value, and inputs a resultant output signal to the non-inverting input terminal (+) of the operational amplifier 4 of the constant current circuit 3. On the basis of an output signal of the operational amplifier 4, a current for obtaining the specified laser output with respect to the specified input flows through the transistor 5 of the constant current circuit 3 and the semiconductor laser element 2. Thereby, the calibration for the laser control is performed, and the laser control in the data recording in the production of a master disc is performed. Thereafter, favorable data recording is performed for a certain period of time. The above-described calibration is repeatedly performed every allowable certain period of time. Therefore, the recording device can be used for a long period of time until the semiconductor laser element 2 is destroyed.

According to the laser control method and the laser control circuit 31 of the first embodiment, the calibration of the gain and the bias used for the laser control is automatically performed to obtain an appropriate applied laser output. Further, the calibration is periodically and repeatedly performed every certain period of time to readjust the bias and the gain of the laser control circuit 31. Accordingly, long-term laser control can be performed, and the laser output can be stabilized for a long period of time. It is therefore possible to continue to use the optical pickup 11 until the semiconductor laser element 2 is destroyed.

3. Second Embodiment

Figure 3:
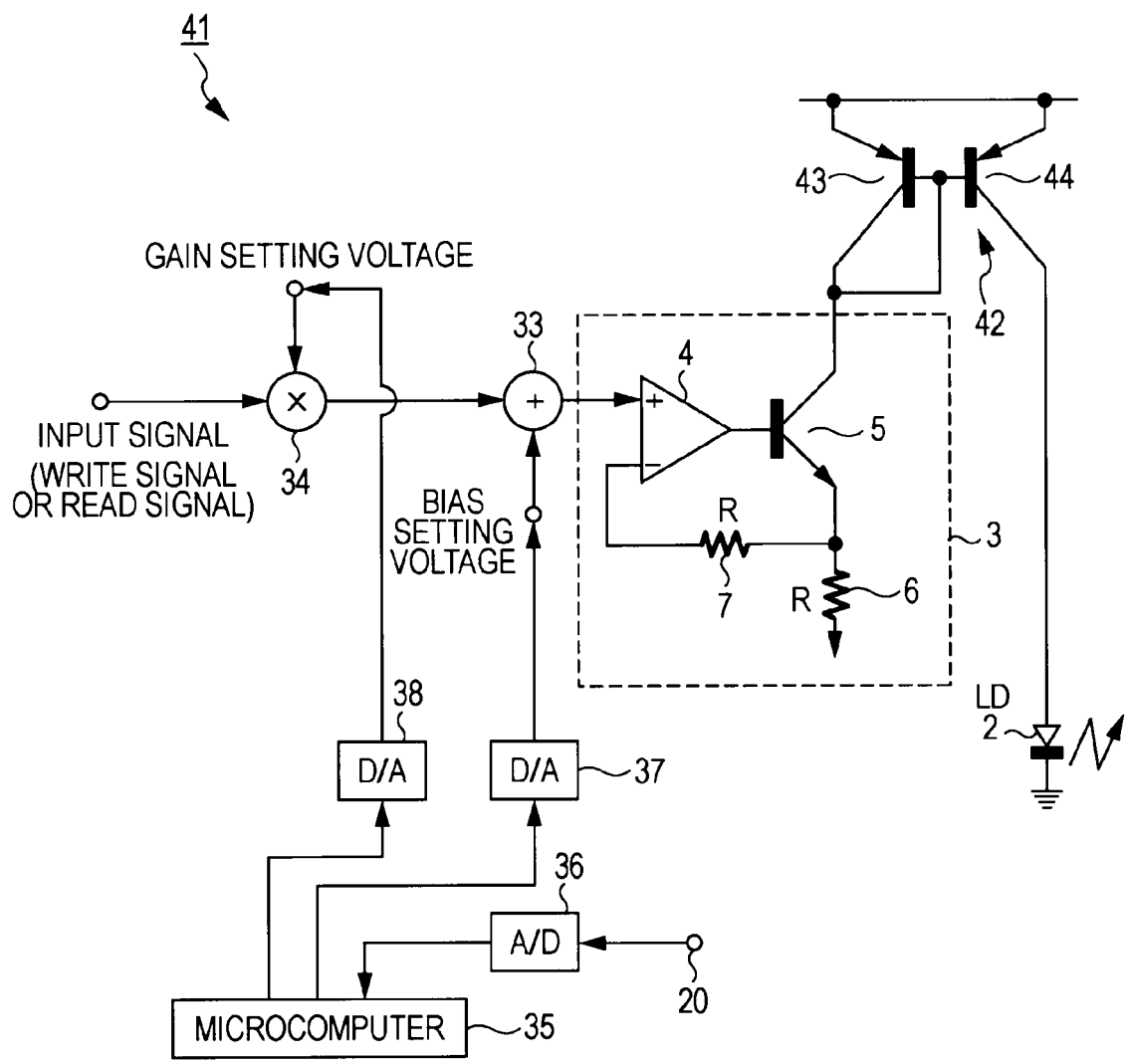
FIG. 3 is a configuration diagram of a laser control circuit according to a second embodiment of the present invention.

Example of Laser Control Method and Laser Control Circuit: FIG. 3 illustrates a laser control method and a laser control circuit according to a second embodiment of the present invention. A laser control circuit 41 according to the second embodiment is a circuit configured to be adjusted to an embodiment of the semiconductor laser element. As an embodiment of the semiconductor laser element, there is a semiconductor laser element configured such that a semiconductor laser chip is disposed in, for example, a metal package, and that a cathode (K) pin and an anode (A) pin are drawn from a base portion of the package. In this embodiment, the cathode (K) pin also functions as a ground (GND). The laser control circuit of the present embodiment has a circuit configuration suitable for the use of the semiconductor laser element of the above-described embodiment.

The second embodiment uses the optical pickup 11 of FIG. 1 including the semiconductor laser element 2, similarly as in the above-described example.

The laser control circuit 41 according to the present embodiment is configured to include the constant current circuit 3, the adder 33 and the multiplier 34 disposed at a stage preceding the constant current circuit 3, and a current mirror circuit 42 connected to a stage subsequent to the constant current circuit 3. The constant current circuit 3 is similar to the corresponding circuit of the above-described example, and thus redundant description thereof will be omitted. Further, similarly as in the above-described example, the multiplier 34 is configured such that the input signal, which is the write signal in the present example, is input to the first input terminal thereof, and that the gain setting voltage is input to the second input terminal thereof. The output terminal of the multiplier 34 is connected to the first input terminal of the adder 33. The second input terminal of the adder 33 is applied with the bias setting voltage, and the output terminal of the adder 33 is connected to the non-inverting input terminal (+) of the operational amplifier 4 of the constant current circuit 3.

The current mirror circuit 42 is configured to include a first transistor 43 monitoring the current flowing through the transistor 5 of the constant current circuit 3, and a second transistor 44 forming a current mirror configuration with the first transistor 43. Each of the first transistor 43 and the second transistor 44 forming the current mirror circuit 42 is formed by, for example, a PNP transistor. The collector of the first transistor 43 is connected to the collector of the transistor 5 of the constant current circuit 3, and the emitter of the first transistor 43 is connected to the power supply. The emitter of the second transistor 44 is connected to the power supply, and the collector of the second transistor 44 is connected to the anode of the semiconductor laser element 2. The respective gates of the first transistor 43 and the second transistor 44 are connected to each other, and the gates are connected to the collector of the transistor 5 of the constant current circuit 3.

Meanwhile, similarly as in the first embodiment, the microcomputer 35, the first A/D converter 36, the first D/A converter 37, and the second D/A converter 38 are provided. The input terminal of the first A/D converter 36 is connected to the output terminal of the power meter 20 of the optical pickup 11, and the output terminal of the first A/D converter 36 is connected to the microcomputer 35. The input terminal of the first D/A converter 37 is connected to the microcomputer 35, and the output terminal of the first D/A converter 37 is connected to the second input terminal of the adder 33 supplied with the bias setting voltage. The input terminal of the second D/A converter 38 is connected to the microcomputer 35, and the output terminal of the second D/A converter 38 is connected to the second input terminal of the multiplier 34 supplied with the gain setting voltage.

Subsequently, the laser control method of the second embodiment and the operation of the laser control circuit 41 will be described. In the second embodiment, the reference bias value and the reference gain value are calculated in a similar manner as in the first embodiment. The reference bias value (voltage) and the reference gain value (voltage) are automatically calculated by a program stored in the microcomputer 35, on the basis of the actually measured values obtained by the use of the power meter 20 and input to the microcomputer 35 via the first A/D converter 36. The reference bias value is supplied to the second input terminal of the adder 33 via the first D/A converter 37. Further, the reference gain value is switched from the initial arbitrary gain value to the calculated reference gain value and supplied to the second input terminal of the multiplier 34 via the second D/A converter 38.

After the normal input signal is input to the first input terminal of the multiplier 34, the input signal is multiplied by the reference gain value, and a resultant output signal is input to the first input terminal of the adder 33. The adder 33 adds the output signal of the multiplier 34 to the reference bias value, and inputs a resultant output signal to the non-inverting input terminal (+) of the operational amplifier 4 of the constant current circuit 3. On the basis of an output signal of the operational amplifier 4, a current for obtaining the specified laser output with respect to the specified input flows through the first transistor 43 of the current mirror circuit 42 and the transistor 5 of the constant current circuit 3. The current mirrors the current of the other second transistor 44, and thus the same current as the current of the first transistor 43 flows from the second transistor 44 into the semiconductor laser element 2. Thereby, the calibration for the laser control is performed, and the laser control in the data recording in the production of a master disc is performed. Thereafter, favorable data recording is performed for a certain period of time. The above-described calibration is repeatedly performed every allowable certain period of time. Therefore, the recording device can be used for a long period of time until the semiconductor laser element 2 is destroyed.

According to the laser control method and the laser control circuit 41 of the second embodiment, the calibration of the gain and the bias used for the laser control is automatically performed to obtain an appropriate applied laser output. Further, the calibration is periodically and repeatedly performed every certain period of time to readjust the bias and the gain of the circuit. Accordingly, long-term laser control can be performed, and the laser output can be stabilized for a long period of time. It is therefore possible to continue to use the optical pickup 11 until the semiconductor laser element 2 is destroyed.

4. Third Embodiment

Figure 4:
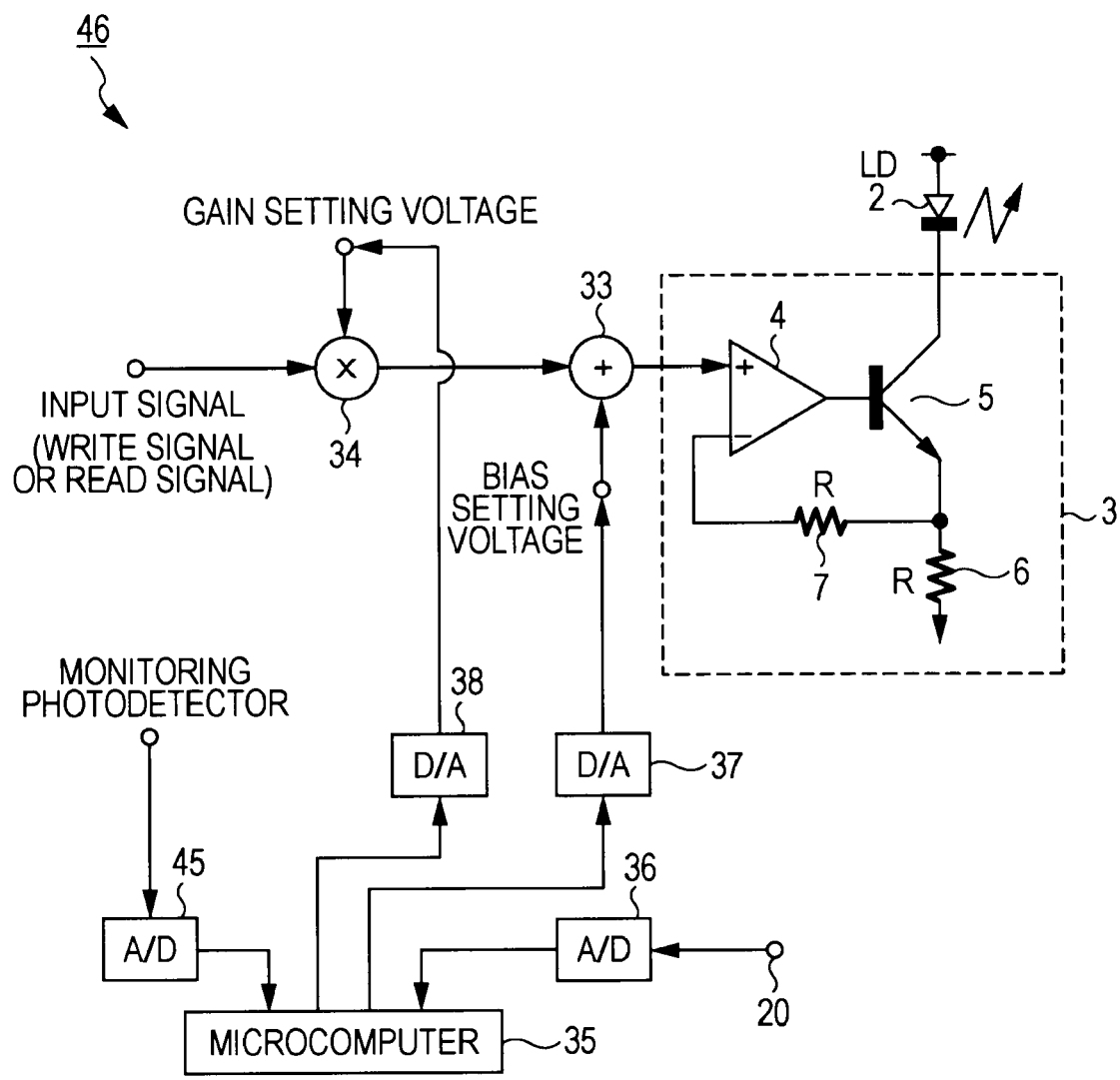
FIG. 4 is a configuration diagram of a laser control circuit according to a third embodiment of the present invention.

Example of Laser Control Method and Laser Control Circuit: FIG. 4 illustrates a laser control method and a laser control circuit according to a third embodiment of the present invention. The present embodiment also uses the optical pickup 11 of FIG. 1 including the semiconductor laser element 2, similarly as in the above-described example.

Similarly as in the above-described first embodiment, a laser control circuit 46 according to the third embodiment has a circuit configuration formed by the constant current circuit 3 connected to the cathode of the semiconductor laser element 2 provided to the optical pickup 11, and the adder 33 and the multiplier 34 connected to a stage preceding the constant current circuit 3. The constant current circuit 3 is similar to the corresponding circuit of the above-described example, and thus redundant description thereof will be omitted. Further, similarly as in the above-described example, the multiplier 34 is configured such that the input signal, which is the write signal in the present example, is input to the first input terminal thereof, and that the gain setting voltage is input to the second input terminal thereof. The output terminal of the multiplier 34 is connected to the first input terminal of the adder 33. The second input terminal of the adder 33 is applied with the bias setting voltage, and the output terminal of the adder 33 is connected to the non-inverting input terminal (+) of the operational amplifier 4 of the constant current circuit 3.

Meanwhile, the microcomputer 35, the first A/D converter 36, a second A/D converter 45, the first D/A converter 37, and the second D/A converter 38 are provided. The input terminal of the first A/D converter 36 is connected to the output terminal of the power meter 20 of the optical pickup 11, and the output terminal of the first A/D converter 36 is connected to the microcomputer 35. The input terminal of the first D/A converter 37 is connected to the microcomputer 35, and the output terminal of the first D/A converter 37 is connected to the second input terminal of the adder 33 supplied with the bias setting voltage. The input terminal of the second D/A converter 38 is connected to the microcomputer 35, and the output terminal of the second D/A converter 38 is connected to the second input terminal of the multiplier 34 supplied with the gain setting voltage. The input terminal of the second A/D converter 45 is connected to the output terminal of the monitoring photodetector 22 of the optical pickup 11, and the output terminal of the second A/D converter 45 is connected to the microcomputer 35.

Subsequently, the laser control method of the third embodiment and the operation of the laser control circuit 41 will be described. The third embodiment performs calibration similar to the calibration of the first embodiment, and laser control with respect to the minute fluctuation of the laser output during the interval (period) between a calibration and the next calibration. That is, in the third embodiment, the reference bias value and the reference gain value are calculated in a similar manner as in the first embodiment. The reference bias value and the reference gain value are automatically calculated by a program stored in the microcomputer 35, on the basis of the actually measured values obtained by the use of the power meter 20 and input to the microcomputer 35 via the first A/D converter 36. The reference bias value is supplied to the second input terminal of the adder 33 via the first D/A converter 37. Further, the reference gain value is switched from the initial arbitrary gain value to the calculated reference gain vague and supplied to the second input terminal of the multiplier 34 via the second D/A converter 38.

After the normal input signal is input to the first input terminal of the multiplier 34, the input signal is multiplied by the reference gain value, and a resultant output signal is input to the first input terminal of the adder 33. The adder 33 adds the output signal of the multiplier 34 to the reference bias value, and inputs a resultant output signal to the non-inverting input terminal (+) of the operational amplifier 4 of the constant current circuit 3. On the basis of an output signal of the operational amplifier 4, a current for obtaining the specified laser output with respect to the specified input flows through the transistor 5 of the constant current circuit 3 and the semiconductor laser element 2. Thereby, calibration for laser control similar to the calibration described in the first embodiment is performed. The calibration is repeatedly performed every allowable certain period of time in a similar manner as in the above-described example.

Meanwhile, the laser output is detected by the monitoring photodetector 22 of the optical pickup 11 every certain period of time, and the detected value, the average value of the detected values, or the like is monitored as necessary. Thereby, the reference bias value is controlled to maintain the laser output to be constant.

In the execution of the above-described periodical calibration, therefore, the relational expression between the bias and the laser output and the relational expression between the output of the monitoring photodetector 22 and the laser output are previously obtained. The microcomputer 35 previously stores a program for obtaining a bias correction value with respect to the laser output fluctuation on the basis of the relational expressions.

In the present embodiment, an output signal representing the above-described detected value or the average value of the detected values received from the monitoring photodetector 22 is input to the microcomputer 35 via the second A/D converter 45 every certain period of time during the interval between the above-described periodical calibrations. If the laser output fluctuates even slightly, the bias correction value is calculated by the program stored in the microcomputer 35. Then, the bias correction value is superimposed on the initial reference bias value, and a resultant reference bias value is input to the adder 33 via the first D/A converter 37. Accordingly, if the laser output fluctuates even slightly during the interval between the periodical calibrations, the laser output can be controlled to an appropriate level.

Generally, the continuous time for performing the recording or reproduction operation is approximately one hour or two. The factors causing the fluctuation of the laser output during this time include two major factors, i.e., (1) the fluctuation of the threshold current Ith due to the temperature characteristic of the semiconductor laser element and (2) the fluctuation of the threshold current Ith included in the fluctuations due to the change over time of the semiconductor laser element. Both factors relate to the fluctuation of the threshold current Ith. With the correction of the bias value, therefore, it is possible to maintain the laser output to be constant while maintaining the linearity of the laser characteristic.

To obtain the above-described bias correction value, the monitoring photodetector 22 is desired to be previously calibrated by the power meter 20.

Further, the deterioration of an optical component in the outgoing optical path of the semiconductor laser light, particularly a change in optical transmittance, leads to a change in the gain of the optical path. Therefore, it is also possible to correct the gain of the laser characteristic during the interval between the periodical calibrations. In the present embodiment, therefore, the relational expression between the gain and the laser output and the relational expression between the output of the monitoring photodetector 22 and the laser output are previously obtained. Then, on the basis of the relational expressions, the gain correction value with respect to the laser output fluctuation is programmed into the microcomputer 35. If the laser output is changed due to the gain fluctuation, the output signal of the monitoring photodetector 22 is input to the microcomputer 35 via the second A/D converter 45. Further, the gain correction value obtained by the calculation performed in the microcomputer 35 is superimposed on the reference gain value, and a resultant reference gain value is input to the multiplier 34. Accordingly, it is possible to correct the gain of the laser characteristic during the interval between the periodical calibrations. It is also possible to perform both the bias correction and the gain correction.

According to the laser control method and the laser control circuit 46 of the third embodiment, it is possible to perform both the correction with respect to long-term laser output deterioration in accordance with the periodical calibration, and the correction with respect to short-term laser output fluctuation in the recording operation by the semiconductor laser. Accordingly, the laser output can be stabilized for a long period of time. Therefore, a stabilized characteristic of the optical pickup 11 can be maintained for a long period of time.

5. Fourth Embodiment

Figure 5:
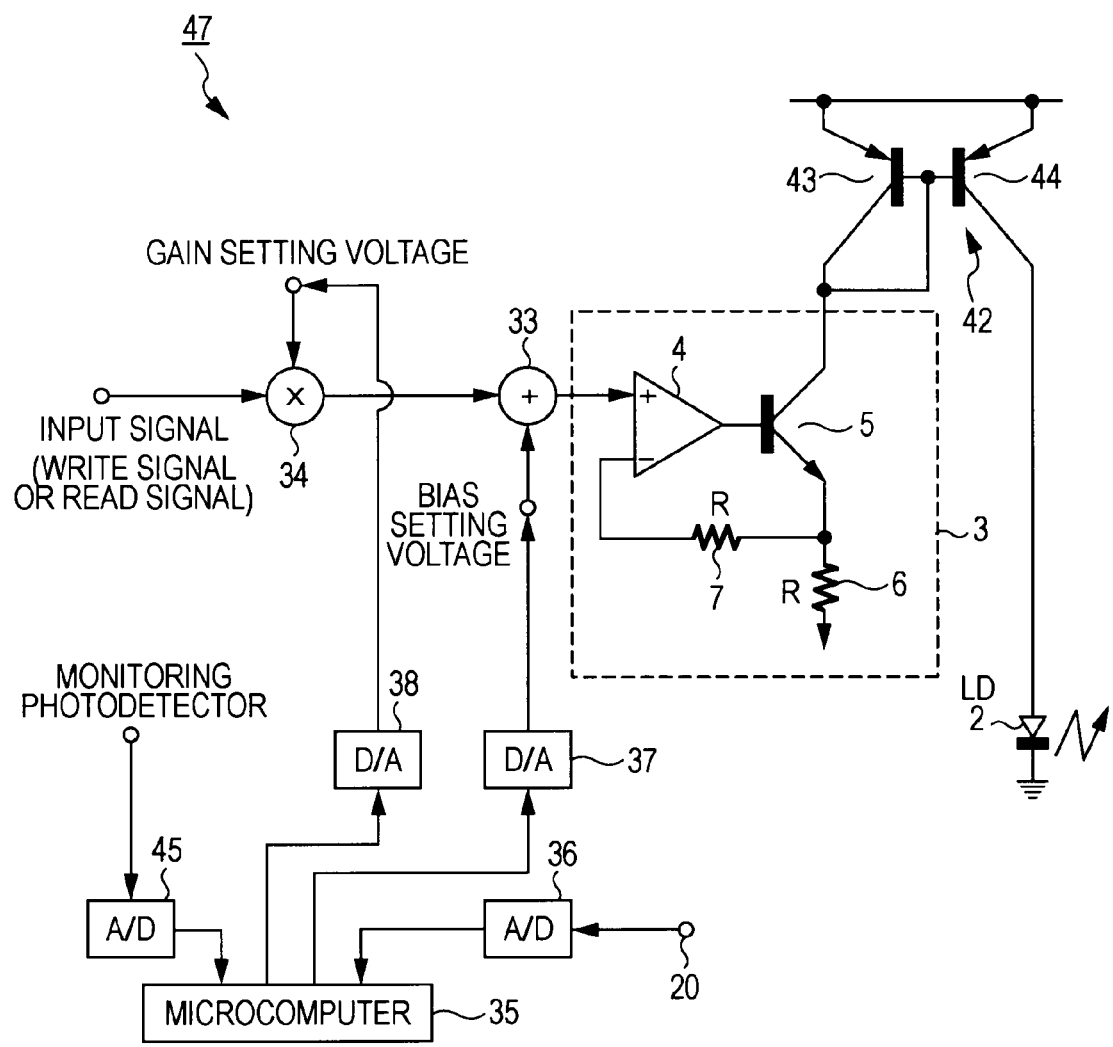
FIG. 5 is a configuration diagram of a laser control circuit according to a fourth embodiment of the present invention.

Example of Laser Control Method and Laser Control Circuit: FIG. 5 illustrates a laser control method and a laser control circuit according to a fourth embodiment of the present invention. The present embodiment corresponds to a modified example of the second embodiment. The present embodiment also uses the optical pickup 11 of FIG. 1 including the semiconductor laser element 2, similarly as in the above-described example.

A laser control circuit 47 according to the fourth embodiment is configured to include the constant current circuit 3, the adder 33 and the multiplier 34 disposed at a stage preceding the constant current circuit 3, and the current mirror circuit 42 connected to a stage subsequent to the constant current circuit 3. The constant current circuit 3 is similar to the corresponding circuit of the above-described example, and thus redundant description thereof will be omitted. Further, similarly as in the above-described example, the multiplier 34 is configured such that the input signal, which is the write signal in the present example, is input to the first input terminal thereof, and that the gain setting voltage is input to the second input terminal thereof. The output terminal of the multiplier 34 is connected to the first input terminal of the adder 33. The second input terminal of the adder 33 is applied with the bias setting voltage, and the output terminal of the adder 33 is connected to the non-inverting input terminal (+) of the operational amplifier 4 of the constant current circuit 3.

Similarly as in the above-described example, the current mirror circuit 42 is configured to include the first transistor 43 monitoring the current flowing through the transistor 5 of the constant current circuit 3, and the second transistor 44 forming a current mirror configuration with the first transistor 43. Each of the first transistor 43 and the second transistor 44 forming the current mirror circuit 42 is formed by, for example, a PNP transistor. The collector of the first transistor 43 is connected to the collector of the transistor 5 of the constant current circuit 3, and the emitter of the first transistor 43 is connected to the power supply. The emitter of the second transistor 44 is connected to the power supply, and the collector of the second transistor 44 is connected to the anode of the semiconductor laser element 2. The respective gates of the first transistor 43 and the second transistor 44 are connected to each other, and the gates are connected to the collector of the transistor 5 of the constant current circuit 3.

Meanwhile, the microcomputer 35, the first A/D converter 36, the second A/D converter 45, the first D/A converter 37, and the second D/A converter 38 are provided. The input terminal of the first A/D converter 36 is connected to the output terminal of the power meter 20 of the optical pickup 11, and the output terminal of the first A/D converter 36 is connected to the microcomputer 35. The input terminal of the first D/A converter 37 is connected to the microcomputer 35, and the output terminal of the first D/A converter 37 is connected to the second input terminal of the adder 33 supplied with the bias setting voltage. The input terminal of the second D/A converter 38 is connected to the microcomputer 35, and the output terminal of the second D/A converter 38 is connected to the second input terminal of the multiplier 34 supplied with the gain setting voltage. The input terminal of the second A/D converter 45 is connected to the output terminal of the monitoring photodetector 22 of the optical pickup 11, and the output terminal of the second A/D converter 45 is connected to the microcomputer 35.

The other parts of the configuration are similar to the corresponding parts described in the third embodiment, and thus redundant description thereof will be omitted.

Subsequently, the laser control method of the fourth embodiment and the operation of the laser control circuit 47 will be described. Similarly as in the third embodiment, the fourth embodiment performs the periodical calibration, and also performs the laser control with respect to the laser output fluctuation every certain period of time during the interval between the calibrations. That is, in the fourth embodiment, the reference bias value and the reference gain value are obtained by a program stored in the microcomputer 35, on the basis of the output signal of the power meter 20, similarly as in the description of the second embodiment. The reference bias value is input to the adder 33 via the first D/A converter 37, and the reference gain value is input to the multiplier 34 via the second D/A converter 38. Then, the periodical calibration is performed to obtain the specified laser output with respect to the specified input.

Meanwhile, on the basis of the detection signal received from the monitoring photodetector 22, the bias correction value is obtained by a program in the microcomputer 35 every certain period of time during the interval between the periodical calibrations. The bias correction value is superimposed on the reference bias value, and a resultant reference bias value is input to the adder 33 via the first D/A converter 37. Accordingly, if the laser output fluctuates even slightly during the interval between the periodical calibrations, appropriate laser output control is performed.

Further, if a gain fluctuation occurs, the gain correction value is obtained by a program stored in the microcomputer 35, on the basis of the detection signal received from the monitoring photodetector 22. The gain correction value is superimposed on the reference gain value, and a resultant reference gain value is input to the multiplier 34 via the second D/A converter 38. Thereby, appropriate laser output control is performed. In this case, it is also possible to obtain the bias correction value and the gain correction value and correct both the reference bias value and the reference gain value, to thereby perform laser output control with respect to the short-term fluctuation.

According to the laser control method and the laser control circuit 47 of the fourth embodiment, it is possible to perform both the correction with respect to the long-term laser output deterioration in accordance with the periodical calibration and the correction with respect to the short-term laser output fluctuation in the recording operation by the semiconductor laser. Accordingly, the laser output can be stabilized for a long period of time. Therefore, a stabilized characteristic of the optical pickup 11 can be maintained for a long period of time.

In the embodiments of the present invention described above, it is possible to automatically control the applied laser output of the semiconductor laser by calculating the reference bias value and the reference gain value. It is also possible to suppress the minute fluctuation of the laser output by automatically controlling the bias value and the gain value of the laser characteristic.

As described above, in the present embodiments, it is possible to stabilize the laser output and reduce the variation in recording pits in the recording operation. Further, the life of the optical pickup of the recording device can be increased. That is, with the light emission waveform corrected by the laser control, a desired light emission characteristic and a desired laser output are obtained to some extent, even if the semiconductor laser element or another optical component is deteriorated. Further, the number of replacements of the optical pickup and the frequency of replacements of a component included in the optical pickup are reduced. Therefore, a so-called downtime can be reduced.

The present embodiments, which are applicable to an optical disc such as a CD, a DVD, and a BD, are preferably applied particularly to a high-density recording BD.

In the above examples, the present invention is applied to the control of the semiconductor laser output in the production of a master optical disc. The present invention is also applicable to the control of the semiconductor laser output in the recording of information on an optical disc or the reproduction of information from an optical disc. In the case of reproduction, a high-frequency pulse signal is input, as the input signal, to the multiplier 34 of the laser control circuit of each of the embodiments. As another embodiment, a DC (Direct Current) signal may be input to the multiplier 34 as the input signal. Alternatively, the input signal or the output of the second D/A converter 38 may be set to be 0 v to obtain an output of 0 v from the multiplier 34, and a DC (Direct Current) output may be supplied from the first D/A converter 37 to the adder 33 to obtain a predetermined output light amount desirable for the reproduction by using the bias setting voltage. In this case, if reproduction noise is large, a separate high-frequency superimposition circuit may be added to the laser (the high-frequency superimposition circuit is common, and thus description thereof will be omitted).

The desired output and dynamic range of the semiconductor laser are different between the recording operation and the reproduction operation. Therefore, the periodical calibration may be performed both with a low output and a high output, which provide different linearities of the laser characteristic. Further, in the optical pickup 11 of FIG. 1, the power meter 20 may be directly used as the laser output detection means disposed in the vicinity of the focus position of the objective lens 19. Alternatively, a photodetector previously calibrated by a power meter may also be used.

Although not illustrated, the present invention can form a semiconductor laser drive device having a structure combining the optical pickup 11 of FIG. 1 with one of the laser control circuits 31, 41, 46, and 47 of the respective embodiments.

The present application contains subject matter related to that disclosed in Japanese Priority Patent Application JP 2008-320122 filed in the Japan Patent Office on Dec. 16, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A laser control method comprising the steps of:
   using a laser control circuit which includes a constant current circuit that maintains a constant current flowing through a semiconductor laser element, and which includes an adder and a multiplier connected to a stage preceding the constant current circuit, and using detection means for calibration for detecting an applied laser output;
   calculating, on the basis of a detection signal output from the detection means, a reference bias value and a reference gain value for obtaining a specified laser output with respect to a specified input to the multiplier;
   inputting the reference bias value and the reference gain value to the adder and the multiplier, respectively; and
   controlling the applied laser output from the semiconductor laser element by performing calibration.

2. The laser control method according to claim 1, further comprising the steps of:
   using a monitoring photodetector which detects laser light emitted from the semiconductor laser element; and
   automatically controlling the reference bias value on the basis of a detection signal obtained from the monitoring photodetector, to thereby control minute fluctuation of the applied laser output.

3. The laser control method according to claim 1, further comprising the steps of:
   using a monitoring photodetector which detects laser light emitted from the semiconductor laser element; and
   automatically controlling the reference bias value and the reference gain value on the basis of a detection signal obtained from the monitoring photodetector, to thereby control minute fluctuation of the applied laser output.

4. The laser control method according to claim 1, wherein the calibration is performed periodically.

5. The laser control method according to claim 1, wherein the input is a write signal for a recording operation.

6. The laser control method according to claim 1, wherein the input is a read signal for a reproduction operation.

7. A laser control circuit comprising:
   a constant current circuit configured to maintain a constant current flowing through a semiconductor laser element;
   an adder connected to an operational amplifier of the constant current circuit, and configured to receive an input of a reference bias value calculated on the basis of a detection signal output from detection means for detecting an applied laser output from the semiconductor laser element; and
   a multiplier connected to the adder, and configured to receive an input of an input signal and an input of a reference gain value calculated on the basis of a detection signal output from the detection means,
   wherein the applied laser output from the semiconductor laser element is automatically controlled.

8. The laser control circuit according to claim 7, further comprising:
   a monitoring photodetector configured to detect laser light emitted from the semiconductor laser element,
   wherein the reference bias value is automatically controlled on the basis of a detection signal output from the monitoring photodetector, to thereby control minute fluctuation of the applied laser output.

9. The laser control circuit according to claim 7, further comprising:
   a monitoring photodetector configured to detect laser light emitted from the semiconductor laser element,
   wherein the reference bias value and the reference gain value are automatically controlled on the basis of a detection signal output from the monitoring photodetector, to thereby control minute fluctuation of the applied laser output.

10. The laser control circuit according to claim 8, further comprising:
    a microcomputer;
    a first Analog-to-Digital converter connected between an output terminal of the detection means and the microcomputer;
    a first Digital-to-Analog converter connected between the microcomputer and an input terminal of the adder input with the reference bias value;
    a second Digital-to-Analog converter connected between the microcomputer and an input terminal of the multiplier input with the reference gain value; and
    a second Analog-to-Digital converter connected between an output terminal of the monitoring photodetector and the microcomputer.

11. The laser control circuit according to claim 7, further comprising:
    a microcomputer;
    a first Analog-to-Digital converter connected between an output terminal of the detection means and the microcomputer;
    a first Digital-to-Analog converter connected between the microcomputer and an input terminal of the adder input with the reference bias value; and
    a second Digital-to-Analog converter connected between the microcomputer and an input terminal of the multiplier input with the reference gain value.

12. The laser control circuit according to claim 7, further comprising:
    a current mirror circuit connected to a stage subsequent to the constant current circuit, and having a current path connected to the semiconductor laser element.

13. The laser control circuit according to claim 7, wherein the input signal is a write signal for a recording operation.

14. The laser control circuit according to claim 7, wherein the input signal is a read signal for a reproduction operation.

15. A laser control circuit comprising:
    a constant current circuit configured to maintain a constant current flowing through a semiconductor laser element;
    an adder connected to an operational amplifier of the constant current circuit, and configured to receive an input of a reference bias value calculated on the basis of a detection signal output from a detection unit configured to detect an applied laser output from the semiconductor laser element; and
    a multiplier connected to the adder, and configured to receive an input of an input signal and an input of a reference gain value calculated on the basis of a detection signal output from the detection unit,
    wherein the applied laser output from the semiconductor laser element is automatically controlled.

* * * * *